United States Patent
Lin

(10) Patent No.: US 8,278,993 B2
(45) Date of Patent: Oct. 2, 2012

(54) CLOCK DISTRIBUTION NETWORK

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/025,777

(22) Filed: Feb. 11, 2011

(65) Prior Publication Data

US 2011/0133811 A1 Jun. 9, 2011

Related U.S. Application Data

(62) Division of application No. 12/408,930, filed on Mar. 23, 2009, now Pat. No. 7,888,991.

(51) Int. Cl.
*G05F 1/10* (2006.01)

(52) U.S. Cl. ........................................ 327/538; 327/541

(58) Field of Classification Search ........... 327/538–543
See application file for complete search history.

(56) References Cited

U.S. PATENT DOCUMENTS

| | | |
|---|---|---|
| 6,333,672 B1 | 12/2001 | Baskett |
| 6,351,191 B1 | 2/2002 | Nair et al. |
| 6,956,413 B2 | 10/2005 | Bailey |
| 6,957,278 B1 * | 10/2005 | Gallagher et al. ................ 710/1 |
| 7,612,606 B2 * | 11/2009 | Marinca ........................ 327/539 |
| 7,888,991 B2 | 2/2011 | Lin |
| 2009/0080267 A1 | 3/2009 | Bedeschi et al. |
| 2010/0237925 A1 | 9/2010 | Lin |

OTHER PUBLICATIONS

Bae, Seung-Jun, et al., "A 60nm 6Gb/s/pin GDDR5 Graphics DRAM with Multifaceted Clocking and ISI/SSN-Reduction Techniques", Digest of Technical Papers. IEEE International Solid-State Circuits Conference, 2008. ISSCC 2008., (2008).

Heydari, Payam, et al., "Design of Ultrahigh-Speed Low-Voltage CMOS CML Buffers and Latches", IEEE Transactions on Very Large Scale Integration (VLSI) Systems, 12(10), (Oct. 2004), 1081-1093.

Lee, Ki-Won, et al., "A 1.5-V 3.2 Gb/s/pin Graphic DDR4 SDRAM with Dual-Clock System, Four-Phase Input Strobing, and Low-Jitter Fully Analog DLL", IEEE Journal of Solid-State Circuits, vol. 42, No. 11, (Nov. 2007), 2369-2377.

Lin, Feng, et al., "A Self-Adaptive and PVT Insensitive Clock Distribution Network Design for High-Speed Memory Interfaces", IEEE Workshop on Microelectronics and Electron Devices, 2009. WMED 2009., (2009), 1-4.

Lin, Feng, et al., "A Wide-Range Mixed-Mode DLL for a Combination 512 Mb 2.0 Gb/s/pin GDDR3 and 2.5 Gb/s/pin GDDR4 SDRAM", IEEE Journal of Solid-State Circuits, 43(3), (Mar. 2008), 631-641.

* cited by examiner

*Primary Examiner* — Ann Luu

(74) *Attorney, Agent, or Firm* — Schwegman, Lundberg & Woessner, P.A.

(57) ABSTRACT

Some embodiments include apparatus and methods having a clock path with a combination of current-mode logic (CML) based and complementary metal-oxide semiconductor (CMOS) components.

18 Claims, 13 Drawing Sheets

200

CLOCK DISTRIBUTION NETWORK

PRIORITY APPLICATION

This application is a divisional of U.S. application Ser. No. 12/408,930 now U.S. Pat. No. 7,888,991, filed Mar. 23, 2009, which is incorporated herein by reference in its entirety.

BACKGROUND

Many integrated circuit (IC) devices, such as processors and memory devices, often use clock signals as timing for data capture and transfer. The device may include a network to distribute clock signals from one location to other locations within the device. Clock signals in these devices are usually susceptible to variations in operating voltage and temperature, potentially causing inaccurate data capture or transfer, especially when these devices operate at high frequency, such as frequency in gigahertz range. Therefore, in some devices, designing a network to distribute clock signals may pose a challenge.

DETAILED DESCRIPTION

Figure 1:
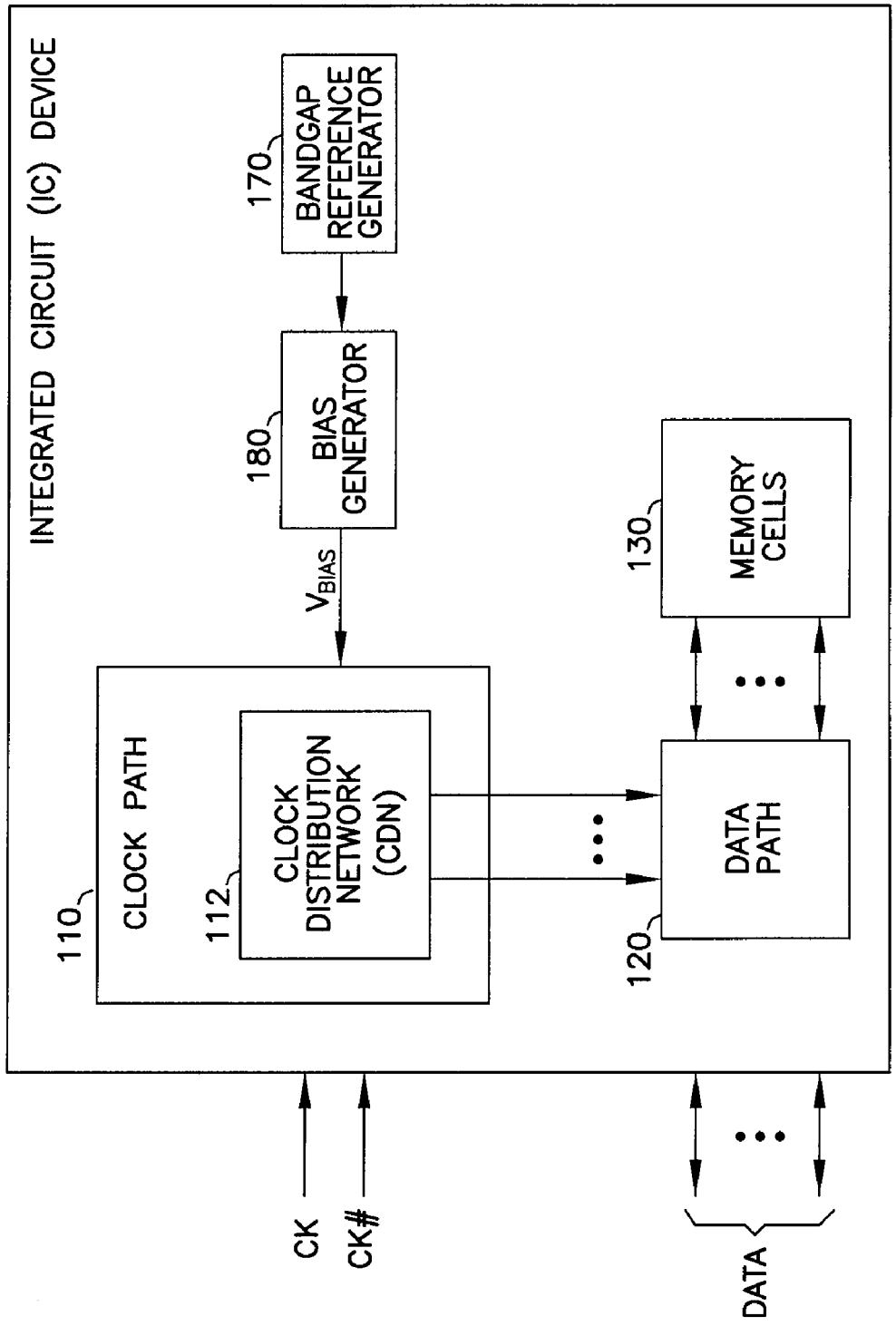
FIG. 1 shows a block diagram of an IC device including a clock path, according to an embodiment of the invention.

FIG. 1 shows a block diagram of an integrated circuit device 100 including a clock path 110, according to an embodiment of the invention. IC device 100 can be a memory device or a processor. Clock path 110 of IC device 100 receives clock signals CK and CK#. The "#" designation in CK# indicates that the CK# signal is inverted with respect to the CK signal. The CK and CK# signals together form a differential signal. Thus, the CK and CK# signals can be considered as components of a differential signal. The CK and CK# signals may be external to IC device 100. Clock path 110 includes a clock distribution network (CDN) 112 to distribute the CK and CK# signals, or signals generated from the CK and CK# signals, to various locations within IC device 100.

IC device 100 also includes a data path 120 to transfer data within IC device 100 or to transfer data to and from IC device 100. In FIG. 1, "DATA" presents the data transfer to and from IC device 100. IC device 100 uses the CK and CK# signals as timing signals to transfer data on data path 120. Data path 120 may include components, such as data receivers, latches, and deserializers. The data receivers can be differential amplifier (e.g., sense-amp based) data receivers. Data on data path 120 includes data transferred to and from memory cells 130.

IC device 100 also includes a bias generator 180 to generate a bias voltage $V_{BIAS}$ based on a bandgap reference generator 170. IC device 100 uses bias voltage $V_{BIAS}$ to control gates of transistors of at least some of the components of clock path 110.

Some of the components of IC device 100, such as clock path 110 and bias generator 180, can be similar to or identical to the components described below with reference to FIG. 2 through FIG. 13.

Figure 2:
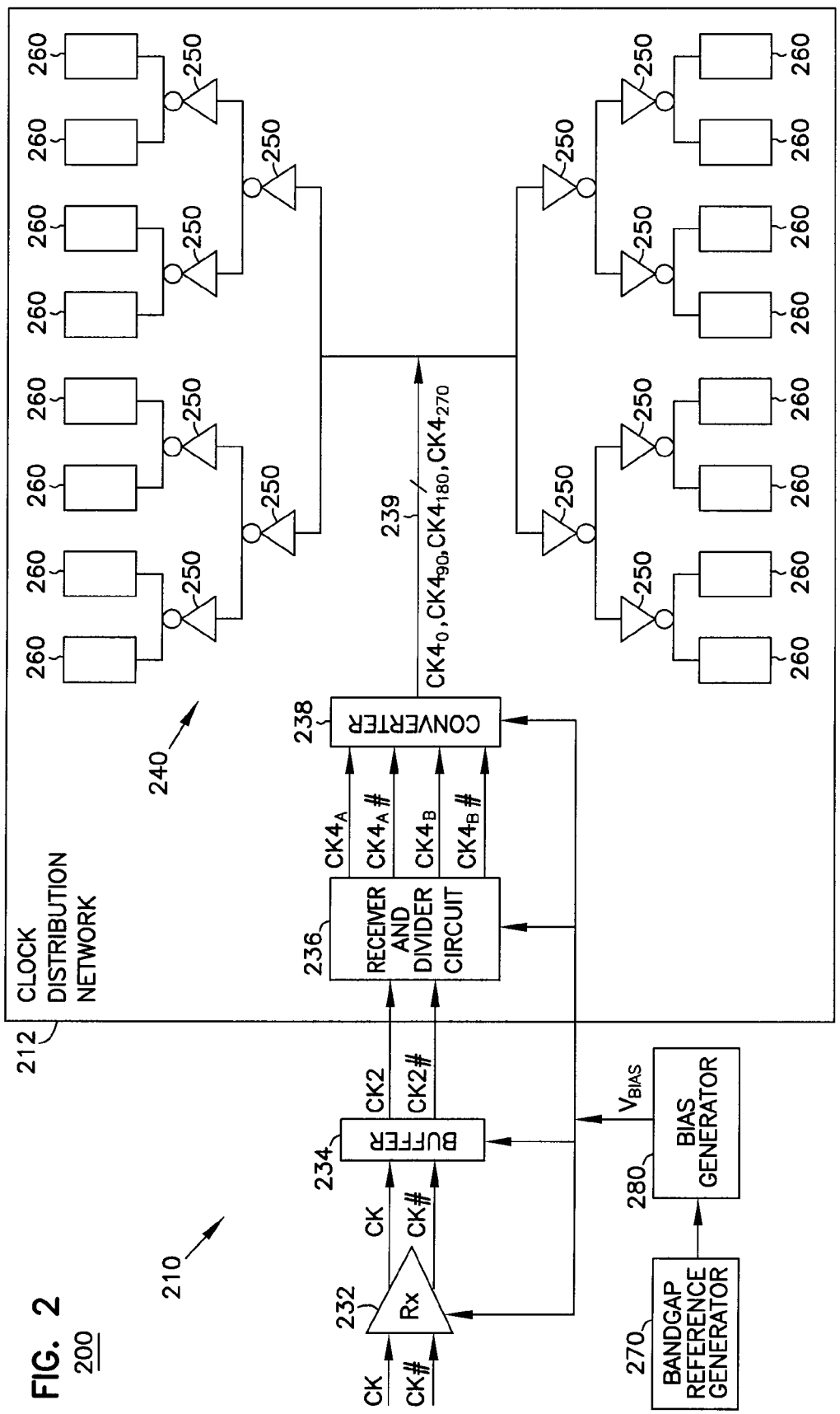
FIG. 2 shows a block diagram of an IC device including a clock path having a clock distribution network (CDN), according to an embodiment of the invention.

FIG. 2 shows a block diagram of an IC device 200 including a clock path 210 having a CDN 212, according to an embodiment of the invention. Clock path 210 includes a receiver 232 to receive a differential clock signal formed by clock signals CK and CK#, which can have a frequency corresponding to a frequency of a clock (e.g., system clock) of a system that includes IC device 200. Clock path 210 uses the CK and CK# signals to generate other clock signals with different phases and different frequencies for internal data capture and transfer within IC device 200.

A buffer 234 receives the CK and CK# signals and generates a 2-phase differential clock signal that includes clock signals CK2 and CK2#. The CK2 and CK2# signals can be generated to have the same frequency as the frequency of the CK and CK# signals. Clock path 210 may include a duty cycle correction circuit (not shown) coupled to receiver 232 and buffer 234 to improve duty cycle of the CK2 and CK2# signals.

CDN 212 includes a receiver and divider circuit 236 to receive the CK2 and CK2# signals to generate 4-phase differential clock signals including a first differential clock signal formed by clock signals $CK4_A$ and $CK4_A\#$, and a second differential clock signal formed by clock signals $CK4_B$ and $CK4_B\#$. The $CK4_A$, $CK4_A\#$, $CK4_B$, and $CK4_B\#$ signals can be generated to have a frequency that is one-half of the frequency of the CK2 and CK2# signals.

CDN 212 also includes a converter 238, which is a current-mode logic (CML) to CMOS signal (CML-to-CMOS) converter and can include a differential to single-ended signal converter. Converter 238 converts four components ($CK4_A$, $CK4_A\#$, $CK4_B$, and $CK4_B\#$) of the two differential clock signals into four single-ended clock signals $CK4_0$, $CK4_{90}$, $CK4_{180}$, and $CK4_{270}$ on lines 239 for distribution to a clock tree system 240.

As shown in FIG. 2, clock path 210 includes a combination of both CML-based and CMOS-based components. CML-based components include receiver 232, buffer 234, receiver and divider circuit 236, and converter 238. CMOS-based components include inverter circuits 250 and local clock trees 260. In this description, a CML-based component refers to a component having input nodes to receive input differential signals and output nodes to provide output differential signals. A CMOS-based component refers to a component having an input node to receive an input CMOS-level signaling and an output node to provide a CMOS-level signaling. A differential signal and a CMOS signal can make a transition from one signal level to another signal level. The transition can be considered a "swing" of the signal. The signal levels can include supply voltage and ground potential levels, which are usually provided through conductors that are sometimes called "rails". The signal swing of CMOS signals generated by CMOS components are generally greater than the signal swing of differential signals received at or generated by CML-based components. For example, CMOS signals can swing from supply voltage level (e.g., Vcc) to ground and vice versa (or rail to rail). Differential signals associated with CML-based components generally have signal swings that are less than rail to rail.

As shown in FIG. 2, inverter circuits 250 and local clock trees 260 are arranged in an H-tree arrangement. Inverter circuits 250 can be considered part of a global clock tree of clock tree system 240. The global clock tree can extend a relatively long distance within IC device 200. Local clock trees 260 can be located locally near data latches and deserializers of IC device 200. The $CK4_0$, $CK4_{90}$, $CK4_{180}$, and $CK4_{270}$ signals have signal levels corresponding to CMOS signal level. Clock tree system 240 distributes the $CK4_0$, $CK4_{90}$, $CK4_{180}$, and $CK4_{270}$ signals to inverter circuits 250 and local clock trees 260 for data capture and transfer.

Each inverter circuit 250 includes four CMOS inverters, and each of the four inverters receives one of the $CK4_0$, $CK4_{90}$, $CK4_{180}$, and $CK4_{270}$ signals. Each local clock tree 260 can include additional inverters (not shown) to further distribute the $CK4_0$, $CK4_{90}$, $CK4_{180}$, and $CK4_{270}$ signals. The single lines between the individual inverter circuits 250 and local clock trees 260 include multiple lines to carry multiple clock signals. FIG. 2 shows these multiple lines as single lines for simplicity.

IC device 200 also includes a bandgap reference generator 270 to generate voltage and current that are substantially constant over variations in the fabricating process, operating voltage and temperature. A bias generator 280 generates a bias voltage $V_{BIAS}$ based on bandgap reference generator 270, such as based on the voltage or current from bandgap reference generator 270. IC device 200 uses bias voltage $V_{BIAS}$ to control the gate of transistors in other components of IC device 200, including CML-based components.

Some conventional clock paths may include only CMOS inverters or only CML-based components. CMOS inverters are generally more susceptible to supply voltage variation than CML-based components. CML-based components generally consume more power than CMOS-based components. Thus, some conventional clock paths may be sensitive to supply voltage variation or may consume relatively more power. In clock path 210, however, a combination of both CML-based components and CMOS-based components can reduce power consumption, or improve sensitivity to supply voltage variation, or both.

CML-based components are generally sensitive to temperature. In some cases, variation in operating temperature can increase the temperature dependency of CML-based components. However, an appropriate value of a bias voltage, such as bias voltage $V_{BIAS}$ of FIG. 2, can reduce the temperature dependency of CML-based components, such as the CML-based components in IC device 200 of FIG. 2. Generation of bias voltage $V_{BIAS}$ is described in more detail below with reference to FIG. 10 through FIG. 13.

Figure 3:
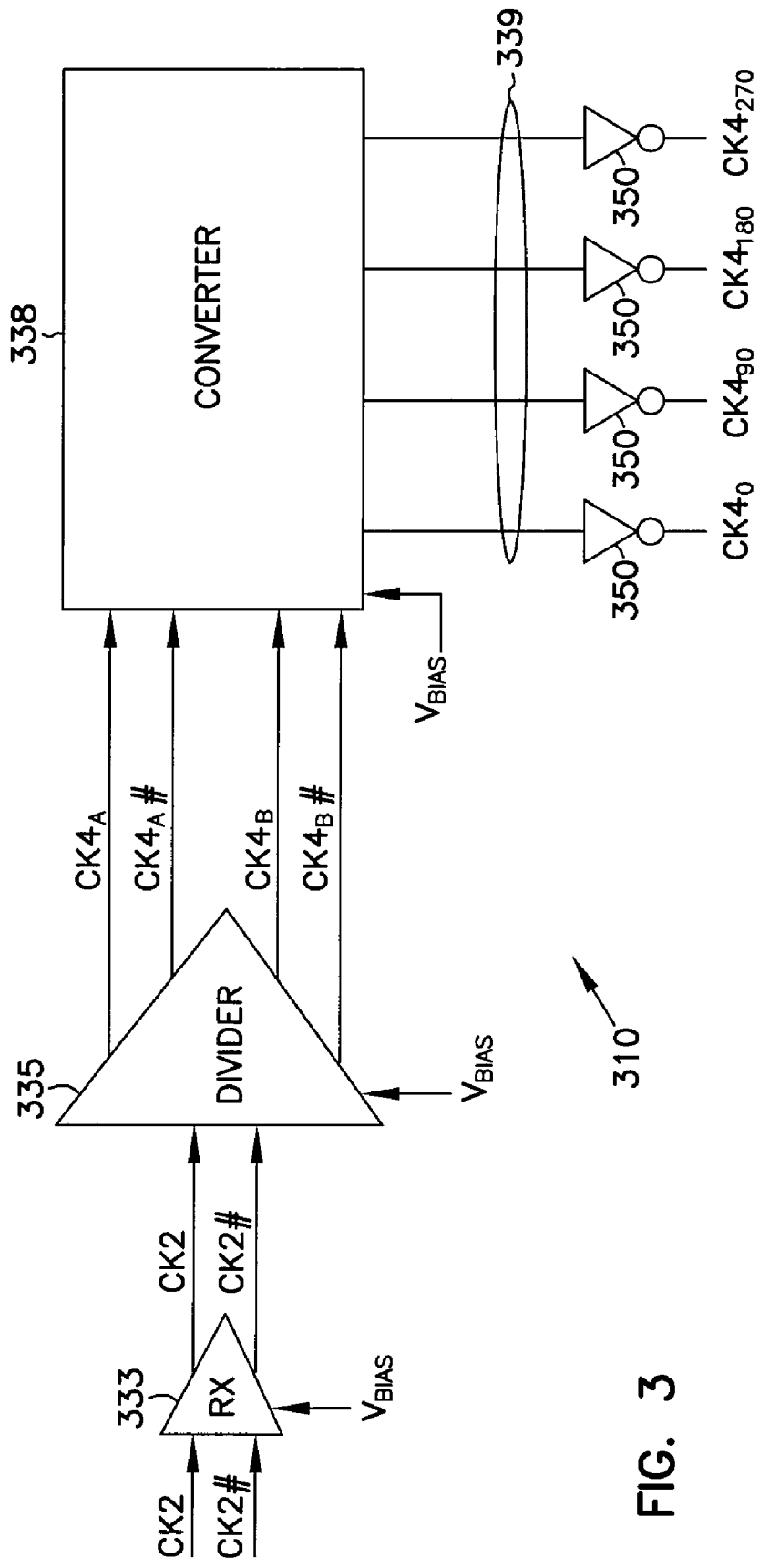
FIG. 3 shows a block diagram of a portion of a clock path including a combination of current-mode logic (CML) based components and complementary metal-oxide semiconductor (CMOS) inverters, according to an embodiment of the invention.

FIG. 3 shows a block diagram of a portion of a clock path 310 including a combination of CML-based components and CMOS inverters, according to an embodiment of the invention. Components of clock path 310 can be used in clock path 210 of FIG. 2. Clock path 310 of FIG. 3 includes additional components similar to those of clock path 210 of FIG. 1. However, FIG. 3 shows only a portion of clock path 310 to focus on specific components shown therein.

As shown in FIG. 3, clock path 310 includes CML-based components, such as receiver 333 and divider 335, and CMOS-based components such as inverters 350. Receiver 333 receives a differential clock signal (CK2/CK2#). Divider 335 receives the CK2 and CK2# signals to generate two different differential clock signals, one formed by the $CK4_A$ and $CK4_A\#$ signals and the other one formed by the $CK4_B$ and $CK4_B\#$ signals.

Converter 338 is a CML-to-CMOS signal converter and can include a differential to single-ended signal converter. Converter 338 converts the two differential clock signals ($CK4_A/CK4_A\#$ and $CK4_B/CK4_B\#$) into four single-ended clock signals $CK4_0$, $CK4_{90}$, $CK4_{180}$, and $CK4_{270}$ on lines 339, which correspond to lines 239 of FIG. 2.

A clock tree system 340 includes four inverters 350, each receiving a corresponding clock signal $CK4_0$, $CK4_{90}$, $CK4_{180}$, or $CK4_{270}$. Inverters 350 provide the $CK4_0$, $CK4_{90}$, $CK4_{180}$, and $CK4_{270}$ signals to one or more branch of clock tree system 340 for further distribution. The $CK4_0$, $CK4_{90}$, $CK4_{180}$, and $CK4_{270}$ signals can be used as clock signals for data latches and other components, such as deserializers, to capture and transfer data.

Figure 4:
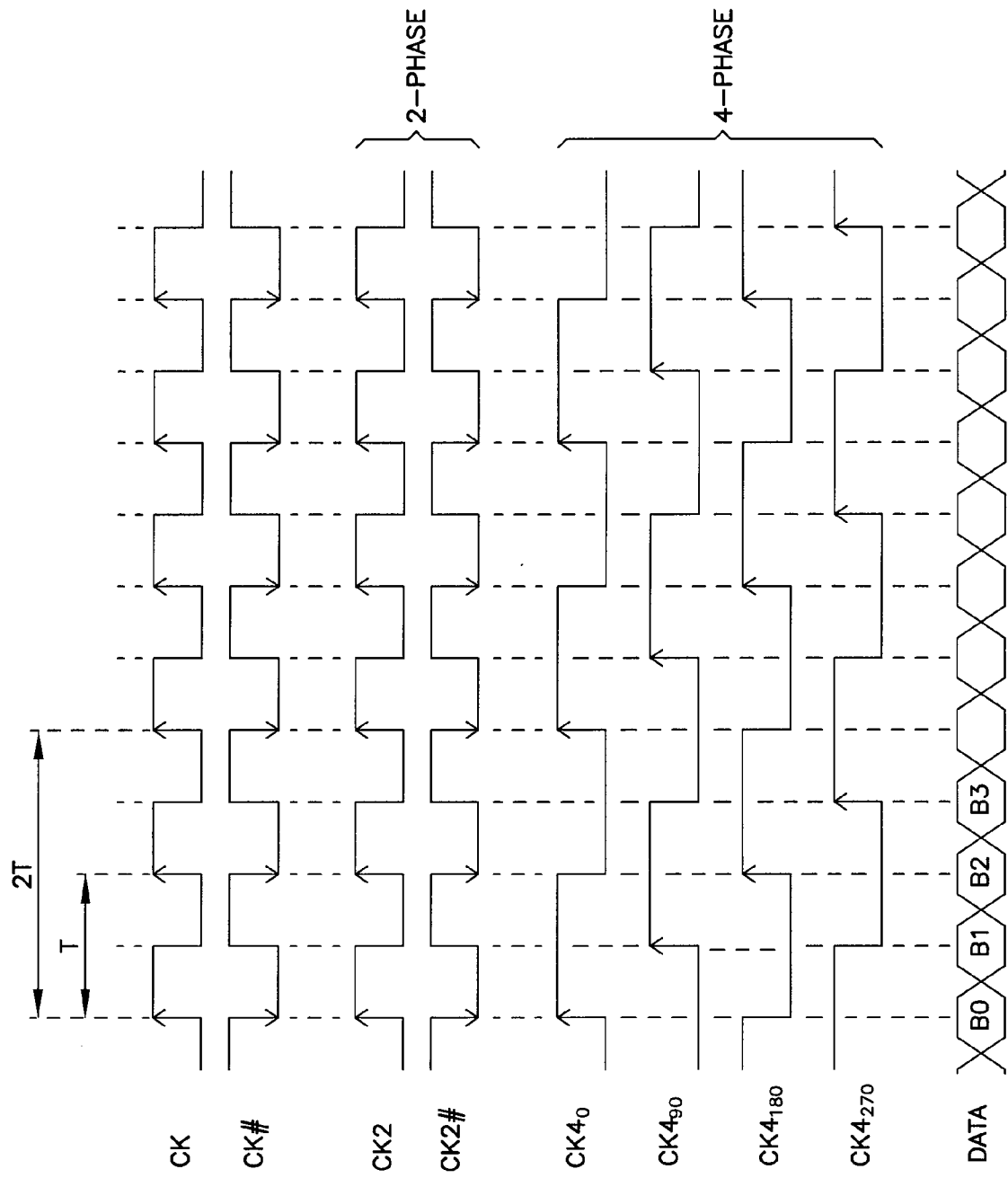
FIG. 4 is a timing diagram showing clock signals having different phases and frequencies, according to an embodiment of the invention.

FIG. 4 is a timing diagram showing clock signals having different phases and frequencies, according to an embodiment of the invention. The clock signals shown in FIG. 4 correspond to the same signals shown in FIG. 1, FIG. 2, and FIG. 3.

As shown in FIG. 4, the CK and CK# signals have a cycle (period) "T" or a frequency $f_1=1/T$.

The CK2 and CK2# signals also have a cycle of T or a frequency $f_2=f_1=1/T$, which is equal to the frequency $f_1$ of the CK signal. The CK2 and CK2# signals are 180 degrees (or ½ of their cycle T) relative to each other.

The $CK4_0$, $CK4_{90}$, $CK4_{180}$, and $CK4_{270}$ signals have a cycle of 2T or a frequency $f_4=1/2T$, which is one-half the frequency $f_2$ of the CK2 and CK2# signals. The $CK4_0$, $CK4_{90}$, $CK4_{180}$, and $CK4_{270}$ signals are 90 degrees (or ¼ of their cycle 2T) out of phase relative to each other.

The data (DATA) can have a frequency $f_D$ equal to four times the frequency $f_4$ of the $CK4_0$, $CK4_{90}$, $CK4_{180}$, and $CK4_{270}$ signals (e.g., $f_D=4f_4=2/T$), such that during each clock cycle T, two bits of data can be captured or transferred. Data capture and transfer can occur at the edge (e.g., rising edge) of the $CK4_0$, $CK4_{90}$, $CK4_{180}$, and $CK4_{270}$ signals. For example, as shown in FIG. 4, four data bits B0, B1, B2, and B3 of the data (DATA) can be captured or can be deserialized using four consecutive rising edges of the $CK4_0$, $CK4_{90}$, $CK4_{180}$, and $CK4_{270}$ signals.

Figure 5:
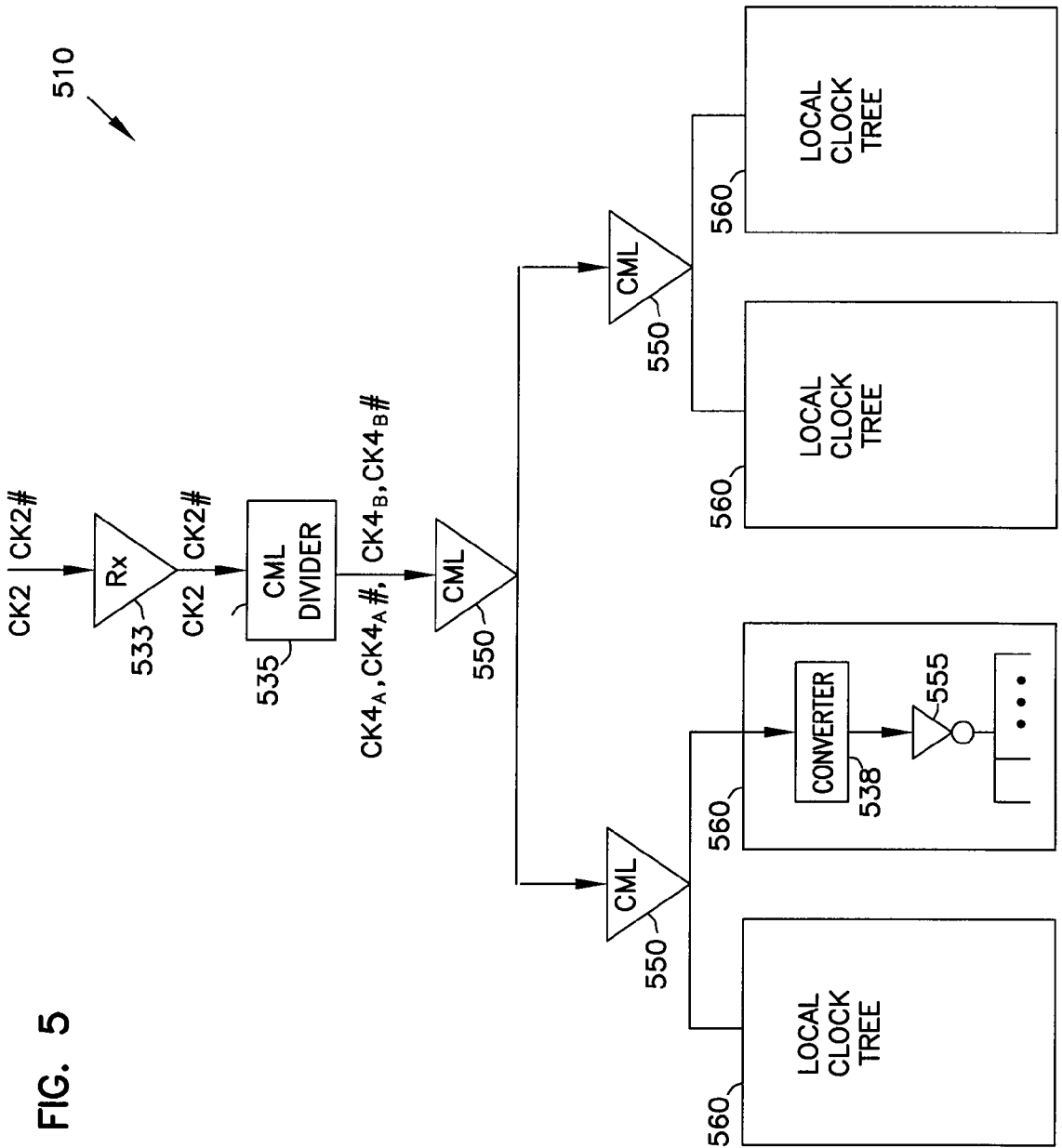
FIG. 5 shows a block diagram of a portion of a clock path with a converter located at local clock trees, according to an embodiment of the invention.

FIG. 5 shows a block diagram of a portion of a clock path 510 with a converter 538 located at local clock trees 560, according to an embodiment of the invention. Clock path 510 includes a combination of CML-based components, such as CML receiver 533, CML divider 535, CML buffers 550, and CMOS-based components, such as CMOS inverter 555. FIG. 5 shows details of components within only one local clock tree 560 for clarity. Local clock trees 560, however, have similar components.

Clock path 510 can be considered a variation of clock path 210 of FIG. 2, with CML buffers 550 in FIG. 5 replacing CMOS inverter circuits 250 of FIG. 2 and converter 538 of FIG. 5 located at local clock trees 560. In FIG. 2, converter 238 is located outside local clock trees 260 and converts differential signals $CK4_A/CK4_A\#$ and $CK4_B/CK4_B\#$ into 4-phase CMOS clock signals ($CK4_0$, $CK4_{90}$, $CK4_{180}$, and $CK4_{270}$). Then, clock path 210 distributes the 4-phase CMOS clock signals to local clock trees 260. In FIG. 5, however, differential signals $CK4_A/CK4_A\#$ and $CK4_B/CK4_B\#$ are distributed to local clock trees 260 by CML buffers 550. Then, converter 538 locally converts differential signals $CK4_A/CK4_A\#$ and $CK4_B/CK4_B\#$ into the 4-phase CMOS clock signals (e.g., $CK4_0$, $CK4_{90}$, $CK4_{180}$, and $CK4_{270}$).

Figure 6:
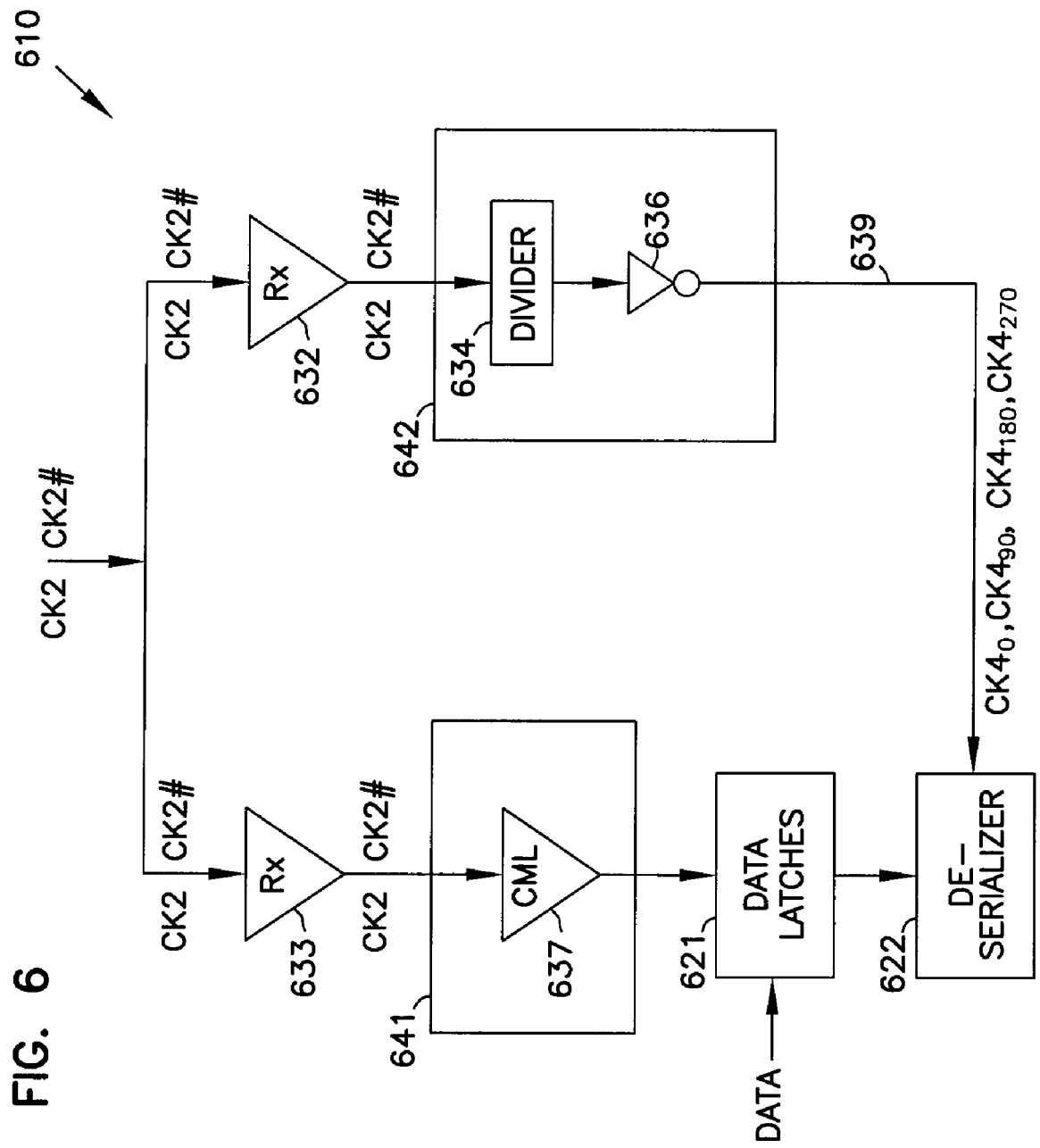
FIG. 6 shows a block diagram of a portion of a clock path with clock trees having different clock phases, according to an embodiment of the invention.

FIG. 6 shows a block diagram of a portion of a clock path 610 with clock trees 641 and 642 having different clock phases, according to an embodiment of the invention. Clock path 610 includes receivers 633 to receive a differential signal, formed by clock signals CK2 and CK2#, and sends it to clock trees 641 and 642. The CK2 and CK2# signals are 2-phase clock signals that clock tree 641 uses as timing signal to capture data (DATA) at latches 621. Clock tree 642 includes a divider 634 and inverter circuit 636 to convert the 2-phase clock signals CK2 and CK2# into 4-phase clock signals $CK4_0$, $CK4_{90}$, $CK4_{180}$, and $CK4_{270}$ on lines 639. Clock tree 642 uses the $CK4_0$, $CK4_{90}$, $CK4_{180}$, and $CK4_{270}$ signals to deserialize data at deserializer 622 before the data is stored, for example, in memory cells.

Figure 7:
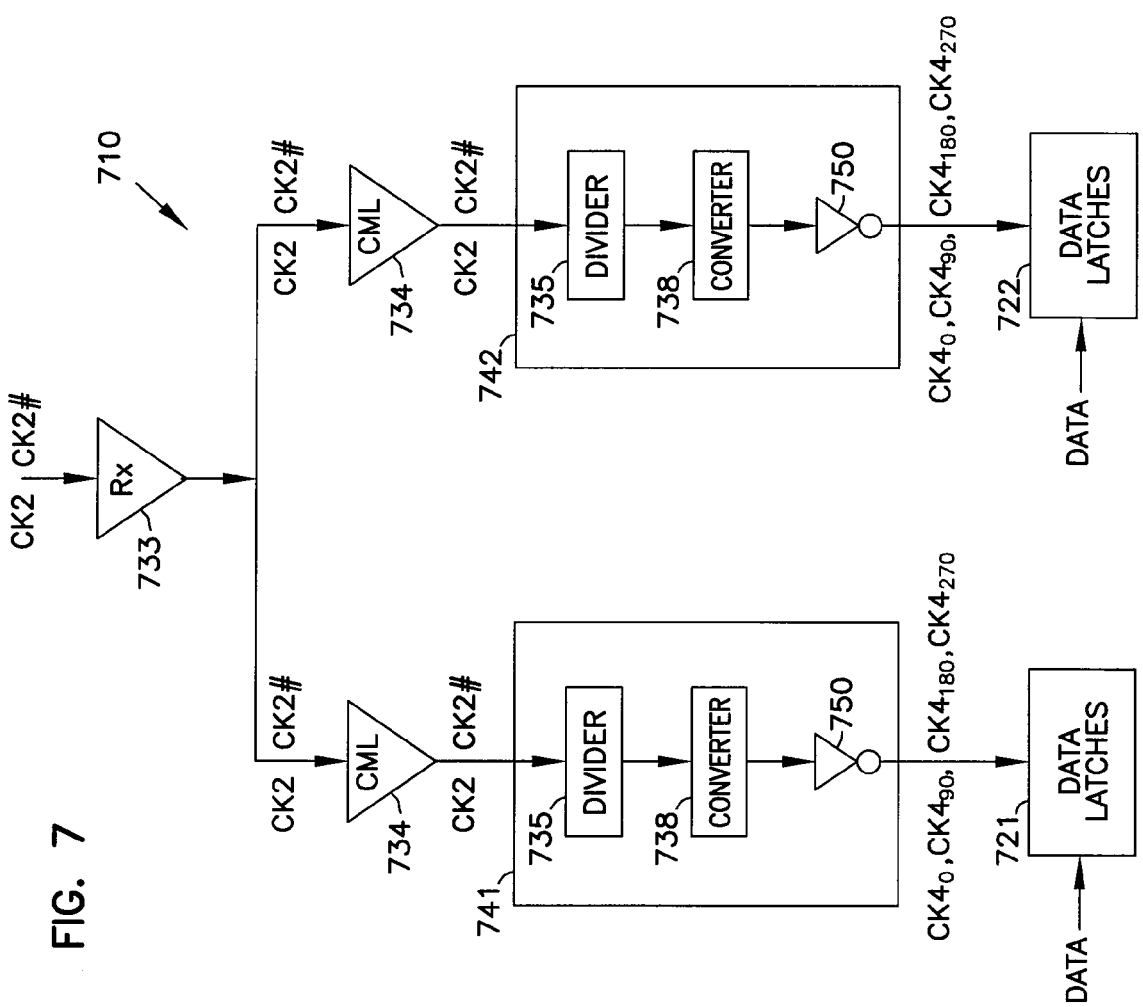
FIG. 7 shows a block diagram of a portion of a clock path with clock trees having the same components, according to an embodiment of the invention.

FIG. 7 shows a block diagram of a portion of a clock path 710 with clock trees 741 and 742 having the same components, according to an embodiment of the invention. Clock path 710 receives a differential clock signal, formed by clock signals CK2 and CK2#, at receiver 733 and sends it to clock trees 741 and 742 via CML buffers 734. Each of clock trees 741 and 742 includes a divider 735, a converter 738, and a CMOS inverter circuit 750 to receive the CK2 and CK2# signals to generate 4-phase CMOS clock signals $CK4_0$, $CK4_{90}$, $CK4_{180}$, and $CK4_{270}$ to capture data (DATA) at data latches 721 or 722.

Figure 8:
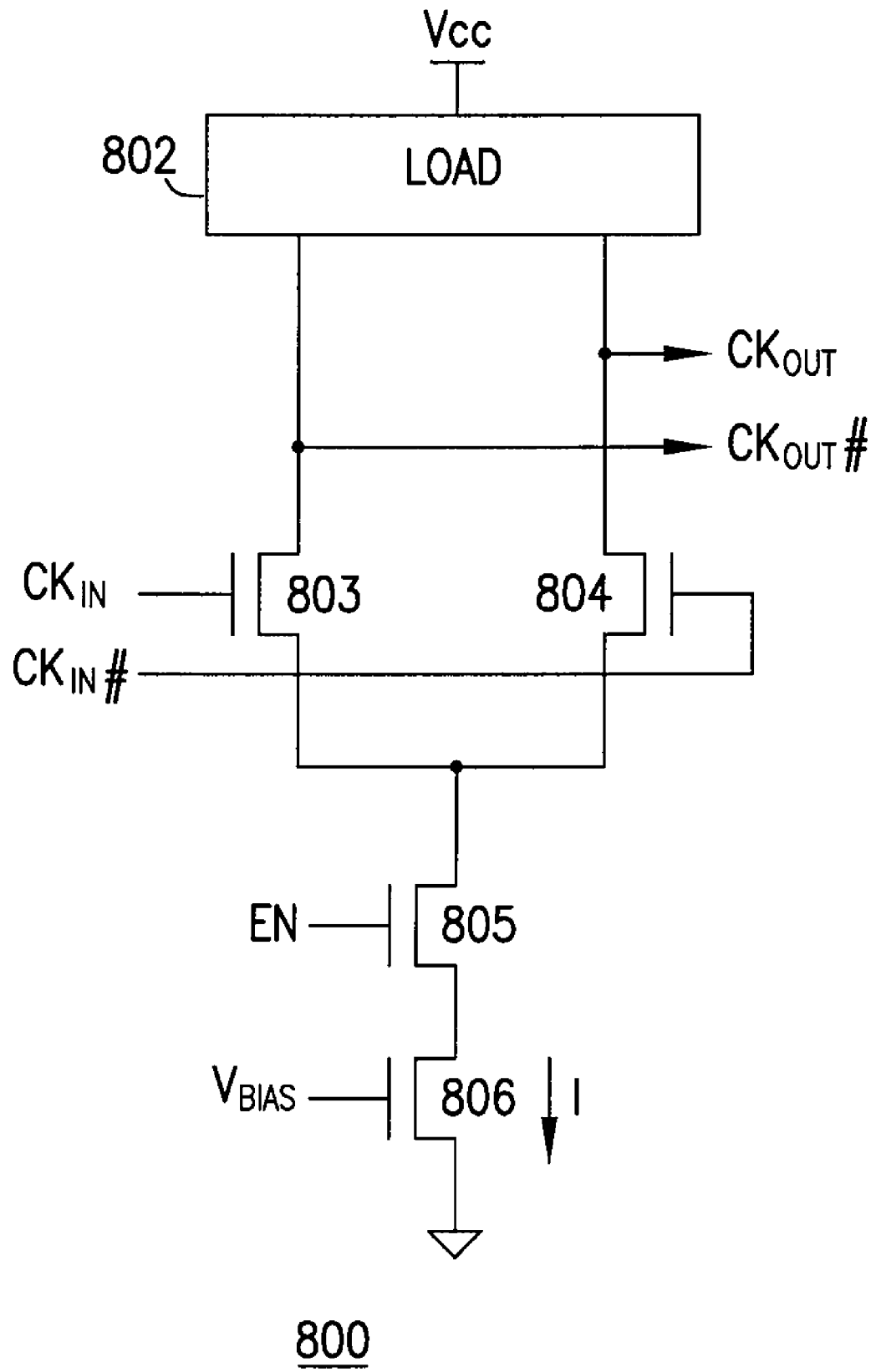
FIG. 8 shows a schematic diagram of a CML-based component, according to an embodiment of the invention.

FIG. 8 shows a schematic diagram of a CML-based component 800, according to an embodiment of the invention. CML-based component 800 has a differential amplifier configuration with a load 802 and a constant current I. CML-based component 800 includes transistors 803 and 804 to receive a differential clock signal, formed by clock signals $CK_{IN}$ and $CK_{IN}\#$, and generate a differential clock signal, formed by clock signals $CK_{OUT}$ and $CK_{OUT}\#$. CML-based component 800 also includes a transistor 805 having a gate controlled by an enable signal EN to activate or deactivate CML-based component 800. CML-based component 800 further includes a transistor 806 having a gate controlled by a bias voltage $V_{BIAS}$. A bias generator, similar to bias generator 280 of FIG. 1, provides bias voltage $V_{BIAS}$. CML-based component 800 with the different amplifier configuration show in FIG. 8 (or with other different amplifier configurations) can be used as receiver 232 of FIG. 2, receiver 333 of FIG. 3, CML buffers 550 of FIG. 5, receivers 633 of FIG. 6, CML buffer 637 of FIG. 6, and CML buffers 734 of FIG. 7. FIG. 8 shows an example of a differential amplifier configuration of CML-based component 800. CML-based component 800, however, can include other differential amplifier configurations.

Figure 9:
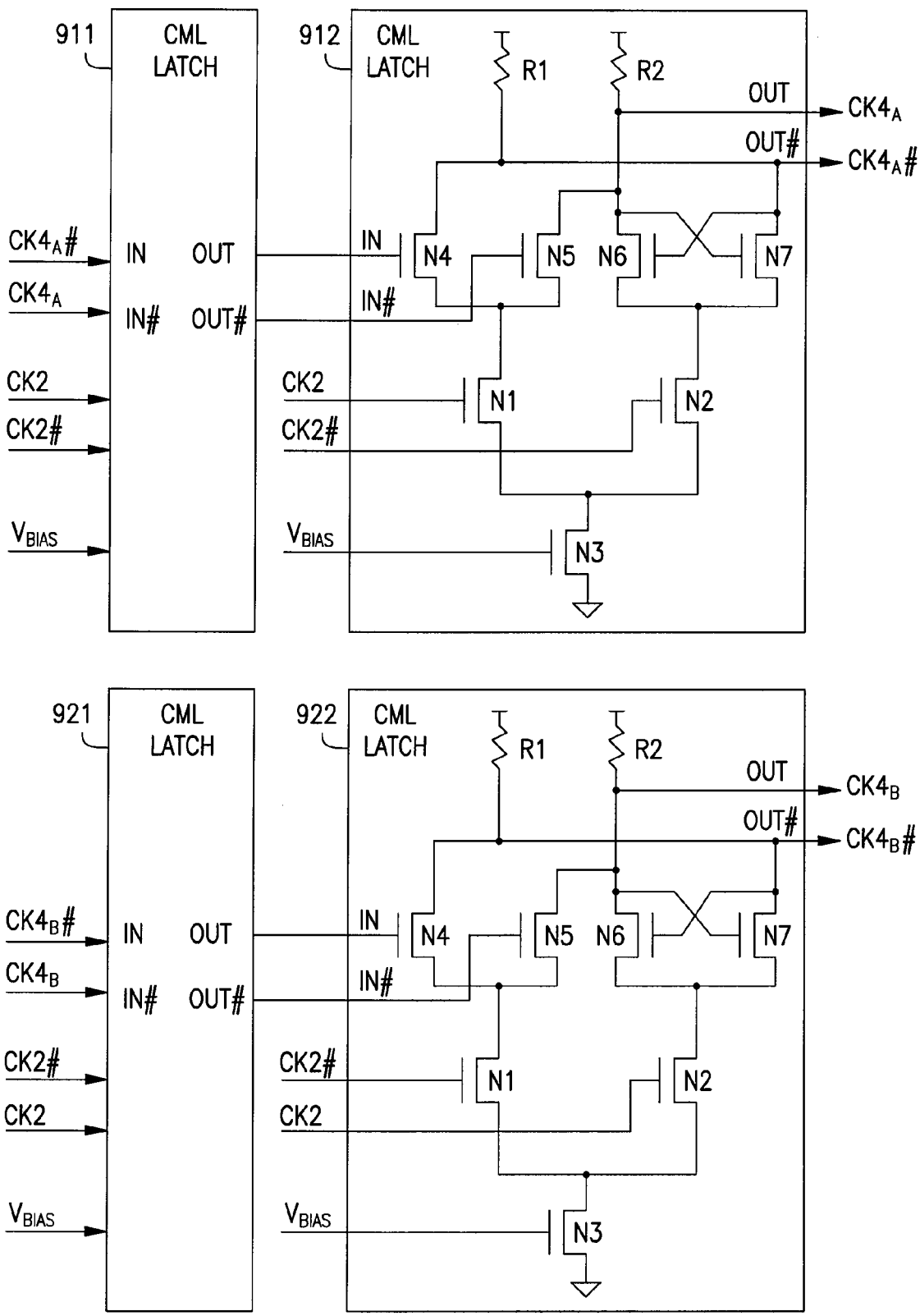
FIG. 9 shows a schematic diagram of a divider circuit, according to an embodiment of the invention.

FIG. 9 shows a schematic diagram of a divider circuit 935, according to an embodiment of the invention. Divider circuit 935 can be used as the divider circuits described above, such as divider 335 of FIG. 3. In FIG. 9, divider circuit 935 is a CML latch-based divider circuit with CML latches 911, 912, 921, and 922. The circuit components, such as transistors N1 through N7 and resistors R1 and R2 of CML latches 911, 912, 921, and 922 are similar and are arranged in similar ways as shown in FIG. 9. For clarity, FIG. 9 omits details of CML latches 911 and 921.

CML latches 911 and 912 form two stages (e.g., master and slave stages) of a first divider to receive a different clock signal that includes clock signals CK2 and CK2# and generate a differential signal that includes clock signals $CK4_A$ and $CK4_A\#$. As shown in FIG. 9, the gates of two transistors N1 and N2 of CML latch 912 are controlled by clock signals CK2 and CK2#, and the gate of a transistor N3 is controlled by a bias voltage $V_{BIAS}$. A bias generator, which can be similar to bias generator 280 of FIG. 2, provides bias voltage $V_{BIAS}$. The $CK4_A$ and $CK4_A\#$ signals generated by latches 911 and 912 have a frequency equal to one-half of the frequency of the CK2 and CK2# signals.

CML latches 921 and 922 form two stages (e.g., master and slave) of a second divider to receive the same CK2 and CK2# signals and generate a differential signal that includes clock signals $CK4_B$ and $CK4_B\#$. CML latches 921 and 922 operate in ways similar to those of CML latches 911 and 912, except that the CK2 and CK2# signals are swapped at gates of transistors N1 and N2 of CML latches 921 and 922. Transistor N3 of CML latch 922 is controlled by the same bias voltage $V_{BIAS}$.

Divider circuit 935 may provide the $CK4_A$, $CK4_A\#$, $CK4_B$, $CK4_B\#$ signals to a converter, such as converter of 238 of FIG. 2 or converter 338 of FIG. 3, to generate 4-phase CMOS clock signals, such as the $CK4_0$, $CK4_{90}$, $CK4_{180}$, and $CK4_{270}$ clock signals of FIG. 2 and FIG. 3.

Figure 10:
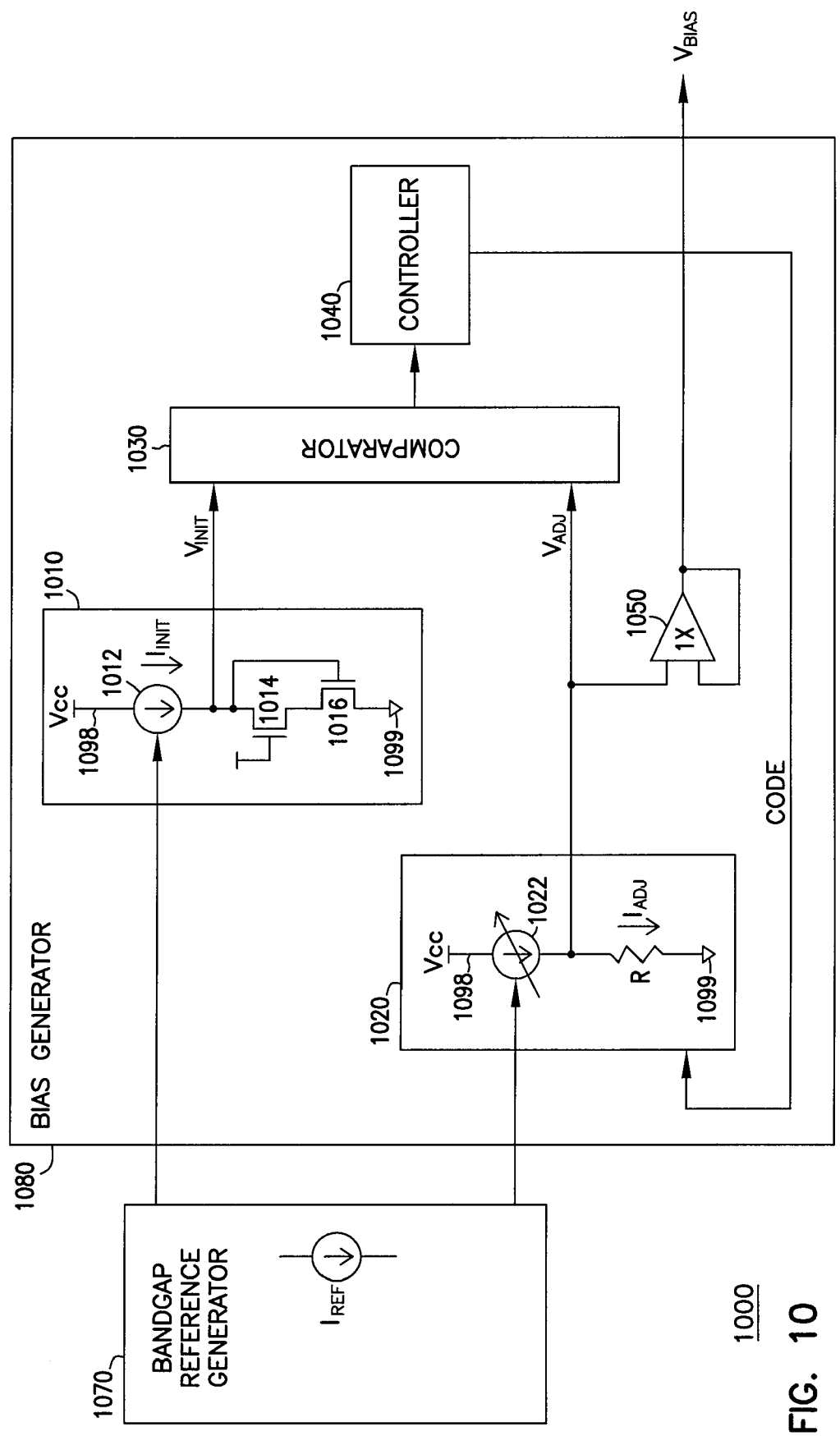
FIG. 10 shows a block diagram of an IC device including a bias generator, according to an embodiment of the invention.

FIG. 10 shows a block diagram of an IC device 1000 including a bias generator 1080, according to an embodiment of the invention. IC device 1000 may include components similar to or identical to those of IC device 100 of FIG. 1 and IC device 200 of FIG. 2. FIG. 10 shows only a portion of IC device 1000 to focus on bias generator 1080 and bandgap reference generator 1070.

Bias generator 1080 generates a bias voltage $V_{BIAS}$, which can be used as bias voltage $V_{BIAS}$ described above with reference to FIG. 1 through FIG. 9.

As shown in FIG. 10, bias generator 1080 includes generator portions 1010 and 1020 to generate voltages $V_{INIT}$ and $V_{ADJ}$ based on a current $I_{REF}$ from bandgap reference generator 1070. Current $I_{REF}$ is a bandgap reference current that is substantially constant over variations in operating voltage and temperature. Bias generator 1080 includes a calibrating process to adjust the value of voltage $V_{ADJ}$ based on the relationship between voltages $V_{INIT}$ and $V_{ADJ}$ during the calibrating process. After the value of voltage $V_{ADJ}$ is adjusted to a selected value, bias generator 1080 stops the calibrating process to maintain the value of bias voltage $V_{BIAS}$. As shown in FIG. 10, bias generator 1080 includes a unity gain amplifier 1050 to provide voltage bias $V_{BIAS}$, which is equal to voltage $V_{ADJ}$. Unity gain amplifier 1050 can act as a filter to improve signal characteristic of bias voltage $V_{BIAS}$.

Generator portion 1010 includes a current source 1012 and a load formed by transistors 1014 and 1016 that are coupled as a diode load and in series with current source 1012 on a circuit path between nodes 1098 and 1099. Node 1098 can include a supply node having a supply voltage Vcc. Node 1099 can include a ground potential. Current source 1012 may include a current mirror to generate current $I_{INIT}$ based on current $I_{REF}$, such that current $I_{INIT}$ can be equal to current $I_{REF}$. As shown in FIG. 10, voltage $V_{INIT}$ is a function of current $I_{INIT}$ and a resistance across the diode load formed by transistors 1014 and 1016.

Figure 11:
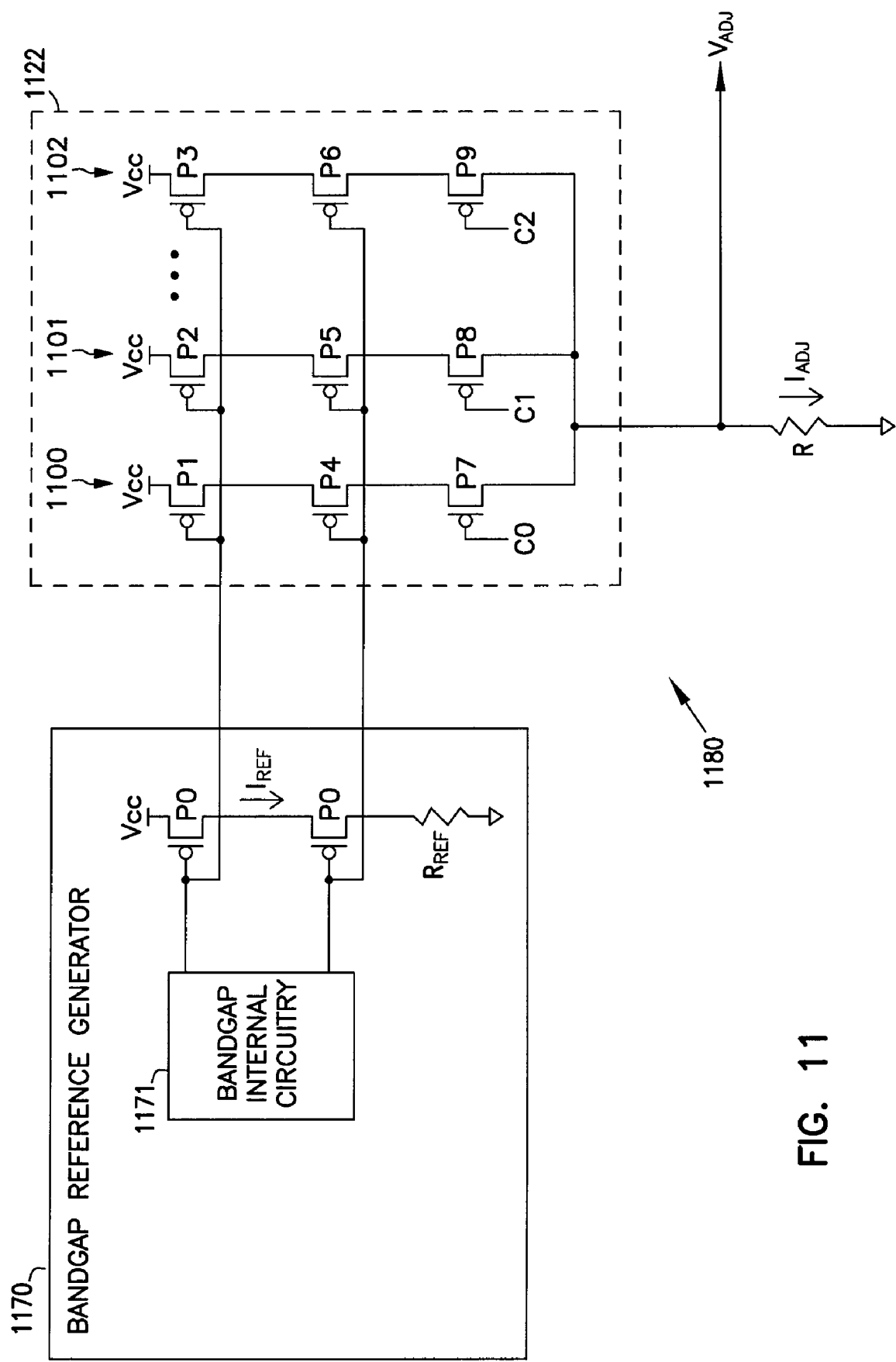
FIG. 11 shows a block diagram of a bias generator with a current source having adjustable parallel current paths, according to an embodiment of the invention.
Figure 12:
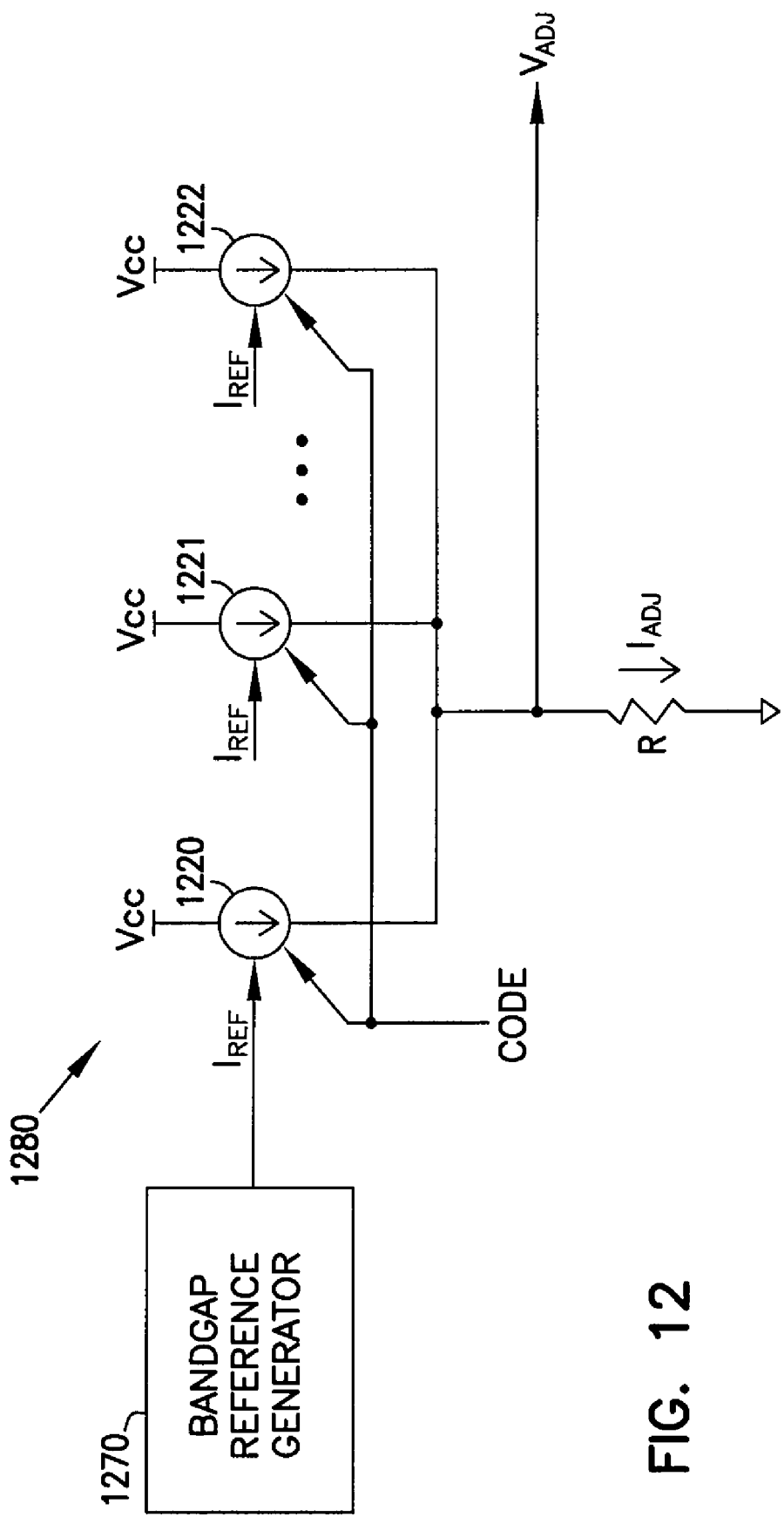
FIG. 12 shows a block diagram of a bias generator having multiple current sources, according to an embodiment of the invention.

Generator portion 1020 includes a current source 1022 and a load, formed by a resistor R, coupled in series with current source 1022 on a circuit path between nodes 1098 and 1099. Current source 1022 may include a current minor to generate current $I_{ADJ}$ based on current $I_{REF}$. Current $I_{ADJ}$ is an adjustable current. It can be adjusted using a code (represented by "CODE" in FIG. 10). The CODE can be a digital code having one or more bits. FIG. 11 and FIG. 12 (described below) show examples of an adjustable current source that can be used for current source 1022 of FIG. 10. As shown in FIG. 10, voltage $V_{ADJ}$ is a function of current $I_{ADJ}$ and the resistance of resistor R. Thus, the value of voltage $V_{ADJ}$ can be adjusted by adjusting the value of current $I_{ADJ}$. Further, since bias voltage $V_{BIAS}$ is generated based on voltage $V_{ADJ}$, bias voltage $V_{BIAS}$ is also a function of current $I_{ADJ}$ and the resistance of resistor R.

As described above, bias generator 1080 includes calibrating process to adjust the value of bias voltage $V_{BIAS}$ based on the relationship between voltages $V_{INIT}$ and $V_{ADJ}$. In FIG. 10, during a calibrating process, a comparator 1030 compares the value of voltage $V_{ADJ}$ with the value of voltage $V_{INIT}$ and adjusts the value of voltage $V_{ADJ}$ based on the results of the comparison. The value of current $I_{INIT}$ and voltage $V_{INIT}$ are not adjusted during the calibrating process. Thus, the value of voltage $V_{INIT}$ can be used as a target value during the calibrating process.

Current source 1022 can be set such that the value of voltage $V_{ADJ}$ is set to a starting value within a voltage range (described below) and less than the value of voltage $V_{INIT}$ at the beginning of the calibrating process. Then, based on the comparison during a calibrating process, a controller 1040 changes the value of the CODE to change the value of current $I_{ADJ}$ and increase the value of voltage $V_{ADJ}$. The adjustment can repeat until the value of voltage $V_{ADJ}$ is at least equal to the value of voltage $V_{INIT}$. Controller 1040 may include a digital counter to set the value of the CODE corresponding to a count value of the counter. Controller 1040 may use the counter to count up, increasing the value of the count value, which can correspond to an increase in the value of current $I_{ADJ}$.

Current source 1022 can be alternatively set such that the value of voltage $V_{ADJ}$ is set to a starting value within a value range and greater than (instead of less than, as described above) the value of voltage $V_{INIT}$ at the beginning of the calibrating process. Then, based on the comparison during a calibrating process, controller 1040 can change the value of the CODE to change the value of current $I_{ADJ}$ and decrease the value of voltage $V_{ADJ}$. In the alternative way, controller 1040 may use a counter to count down, decreasing the value of the count value, which can correspond to a decrement in the value of current $I_{ADJ}$. The adjustment can repeat until the value of voltage $V_{ADJ}$ is at most equal to the value of voltage $V_{INIT}$.

The voltage range of voltage $V_{ADJ}$ (mentioned above) can be determined by measuring its values (e.g., during design) for different process variations. Thus, the voltage range is known before the value of voltage $V_{ADJ}$ is set. The voltage range of voltage $V_{INIT}$ can also be determined by measuring its values for different process corners. Based on the voltage ranges, the starting value of $V_{ADJ}$ at the beginning of the calibrating process can be set to a value within its voltage range (e.g., a lowest value in the voltage range) and less than or greater than the value of voltage $V_{INIT}$.

Bias generator 1080 may perform the calibrating process only one time, for example, only during a power-up sequence of IC device 1000. After the calibrating process, for example, after the power-up sequence, IC device 1000 may switch one or more of generator portion 1010, comparator 1030, and controller 1040 to a lower power mode to save power. Such lower power mode may include an idle mode or an off mode.

IC device 1000 includes an operating temperature range with a first operating temperature limit lower than a second operating temperature limit. Bias generator 1080 may perform the calibrating process to adjust voltage $V_{ADJ}$ at a temperature that is closer to the first operating temperature limit than the second operating temperature limit. For example, IC device 1000 may have an operating temperature range from 0° C. to 100° C. and bias generator 1080 may perform the calibrating process at 25° C. Performing the calibrating process at a relatively lower temperature within operating temperature range may improve performance of device 100.

FIG. 11 shows a block diagram of a bias generator 1180 with a current source 1122 having adjustable parallel current paths 1100, 1101, and 1102, according to an embodiment of the invention. Bias generator 1180 can correspond to bias generator 1080 of FIG. 10. FIG. 11 shows only a portion of generator 1180 to focus on current source 1122, which can correspond to current source 1022 of FIG. 10. In FIG. 11, bias generator 1180 generates a voltage $V_{ADJ}$, which can be used to generate a bias voltage (e.g., $V_{BIAS}=V_{ADJ}$) similar to or identical to bias voltage $V_{BIAS}$ in FIG. 10. In FIG. 11, voltage $V_{ADJ}$ has a value based on the value of a current $I_{ADJ}$ and the resistance of a resistor R. The value of current $I_{ADJ}$ can be generated based on bandgap reference generator 1170.

As shown in FIG. 11, bandgap reference generator 1170 includes a bandgap internal circuitry 1171, transistors P0, and a resistor $R_{REF}$ to generate a bandgap current $I_{REF}$. Current source 1122 includes transistors P1 through P9 arranged in a current mirror configuration with transistors P0 to generate a current $I_{ADJ}$ based on current $I_{REF}$. The value of the current $I_{ADJ}$ is equal to a sum of the values of currents on current paths 1100, 1101, and 1102. Each of these current paths can be configured to have different current values. For example, transistors P1 through P9 can have different sizes so that currents on current paths 1100, 1101, and 1102 can have different values.

Bias generator 1180 receives a code having bits C0, C1, and C2 to select a combination of current paths 1100, 1101, and 1102. FIG. 11 shows current source 1122 having only three current paths 1100, 1101, and 1102 as an example. The number of current paths can vary. The values of bits C0, C1, and C2 can be controlled by a controller, such as controller 1040 of FIG. 10. Depending on which combination of current paths 1100, 1101, and 1102 is selected, the value of current $I_{ADJ}$ is increased or decreased to adjust the value of voltage $V_{ADJ}$.

Bias generator 1180 may adjust voltage $V_{ADJ}$ during a calibrating process similar to or identical to the calibrating process described above with reference to FIG. 10. For example, bias generator 1180 can adjust voltage $V_{ADJ}$ by changing the values of bits C0, C1, and C2 during a calibrating process.

FIG. 12 shows a block diagram of a bias generator 1280 having multiple current sources 1220, 1221, and 1222, according to an embodiment of the invention. Bias generator 1280 can correspond to bias generator 1080 of FIG. 10. FIG. 12 shows only a portion of generator 1280 to focus on current sources 1220, 1221, and 1222. Bias generator 1280 generates a voltage $V_{ADJ}$, which can be used to generate a bias voltage (e.g., $V_{BIAS}=V_{ADJ}$) similar to or identical to bias voltage $V_{BIAS}$ in FIG. 10. In FIG. 12, voltage $V_{ADJ}$ has a value based on the value of a current $I_{ADJ}$ and the resistance of a resistor R. The value of current $I_{ADJ}$ can be generated based on a bandgap current $I_{REF}$ from bandgap reference generator 1270.

Each of current sources 1220, 1221, and 1222 can include multiple parallel current paths similar to the parallel current paths of current source 1122 of FIG. 11. Bias generator 1280 receives a code (represented by "CODE" in FIG. 12) to control the current on each of current sources 1220, 1221, and 1222. The value of current $I_{ADJ}$ is equal to the sum of current from current sources 1220, 1221, and 1222. Multiple current sources 1220, 1221, and 1222 provide bias generator 1280 with more combination of current paths to select, so that current $I_{ADJ}$ can be adjusted with a finer resolution and a wider range of current value.

Figure 13:
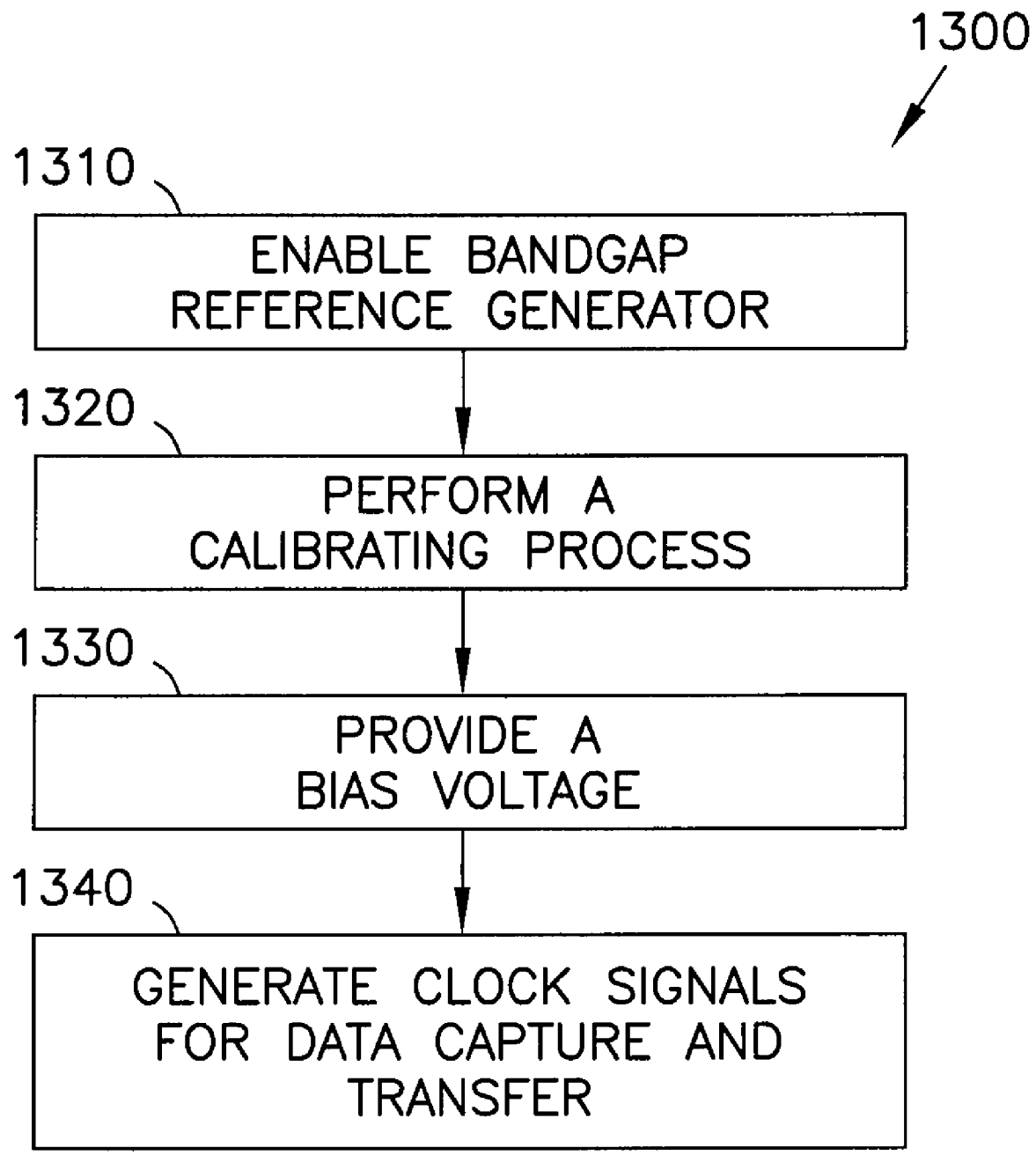
FIG. 13 is a flow diagram of a method, according to an embodiment of the invention.

FIG. 13 is a flow diagram of a method 1300, according to an embodiment of the invention. Method 1300 can be used to generate a bias voltage and clock signals in an IC device.

Method 1300 includes activity 1310 to enable a bandgap reference generator. After the bandgap reference generator is settled, activity 1320 performs a calibrating process to select a value of a voltage (e.g., $V_{ADJ}$) generated based on the bandgap reference generator. The calibrating process in activity 1320 may include activities and operations of a bias generator, such as bias generators 1080, 1180, and 1280 of FIG. 10, FIG. 11, and FIG. 12, respectively. After the calibrating process, method 1300 continues with activity 1330 to provide the bias voltage, which is based on the voltage generated during the calibrating process. The bias voltage can be similar to or identical to bias voltage $V_{BIAS}$ described above with reference to FIG. 1 through FIG. 12. Activity 1330 in FIG. 13 may perform the calibrating process only one time, for example, only during a power-up sequence of the IC device.

Method 1300 also includes activity 1340 to generate clock signals for data capture and transfer. Method 1300 may use the bias voltage provided by activity 1330 to control transistors of CML-based components that method 1300 uses to generate the clock signals. Generation of the clock signals in activity 1330 may include activities and operations described above with reference to FIG. 1 through FIG. 9 to generate clock signals, such as CK2, CK2#, CK4$_A$, CK4$_A$#, CK4$_B$, CK4$_B$#, CK4$_0$, CK4$_{90}$, CK4$_{180}$, and CK4$_{270}$.

One or more embodiments described herein include apparatus and methods having a clock path with a combination of current-mode logic (CML) based and CMOS components. The apparatus and methods further include a bias generator to generate a bias voltage for use in some of the components of the clock path. Other embodiments, including additional methods and devices, are described above with reference to FIG. 1 through FIG. 13.

The illustrations of apparatus such as IC devices 100, 200, and 1000 are intended to provide a general understanding of the structure of various embodiments and not a complete description of all the elements and features of the apparatus that might make use of the structures described herein.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Many other embodiments will be apparent to those of skill in the art upon reading and understanding the above description. For example, the embodiments described above may also apply to a CML/CMOS CDN that uses two-phase clock signals (e.g., CK and CK# or CK2 and CK2#) to capture and transfer data. In the two-phase CML/CMOS CDN, a divider (e.g., CLM divider 535 of FIG. 5) can be omitted.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
   a bias generator configured to generate a voltage based on a bandgap reference generator and to adjust a value of the voltage based on a target value; and
   a node configured to provide a bias voltage based on the voltage, wherein the bias generator is further configured to generate an initial voltage based on the bandgap reference generator, and the target value is based on a value of the initial voltage.

2. An apparatus comprising:
   a bias generator configured to generate a voltage based on a bandgap reference generator and to adjust a value of the voltage based on a target value; and
   a node configured to provide a bias voltage based on the voltage, wherein the bias generator is further configured to generate an initial voltage based on the bandgap reference generator, and the target value is a value of the initial voltage.

3. The apparatus of claim 2, wherein the bias generator is configured to generate the voltage, such that the value of the voltage is at least equal to the value of the initial voltage after the value of the voltage is adjusted.

4. The apparatus of claim 2, wherein the bias generator is configured to generate the voltage, such that the value of the voltage is at most equal to the value of the initial voltage after the value of the voltage is adjusted.

5. An apparatus comprising:
   a bias generator configured to generate a voltage based on a bandgap reference generator and to adjust a value of the voltage based on a target value; and
   a node configured to provide a bias voltage based on the voltage, wherein the bias generator includes a first current source to provide a first current based on a first bandgap current from the bandgap reference generator, a first load coupled in series with the first current source between a first supply node and a second supply node, and a first node coupled in series with the first current source and the load to provide an initial voltage, and wherein the target value is a value of the initial voltage.

6. The apparatus of claim 5, wherein the bias generator includes a second current source to provide a second current based on a second bandgap current from the bandgap reference generator, a second load coupled in series with the second current source between the first and second supply nodes, and a second node coupled in series with the second current source and the second load to provide the voltage.

7. The apparatus of claim 6, wherein the bias generator is configured to change a value of the second current provided by the second current source to adjust the value of the voltage.

8. The apparatus of claim 6, wherein the first load includes a first transistor and a second transistor coupled in series to form a diode load between the first node and one of the first and second supply nodes.

9. The apparatus of claim 6, wherein the second load includes a resistor coupled in series between the second node and one of the first and second supply nodes.

10. The apparatus of claim 6, wherein the second current source includes parallel current paths, and a value of the second current is equal to a sum of values of currents on the parallel current paths.

11. The apparatus of claim 10, wherein the bias generator is configured to provide a digital code to control currents on the parallel current paths.

12. The apparatus of claim 6, wherein the bias generator further includes a unity gain amplifier having an input node to receive the voltage and an output node coupled to the node to provide the bias voltage.

13. A method comprising:
obtaining a first voltage generated based on a bandgap reference generator and a second voltage generated based on the bandgap reference generator;
adjusting a value of the second voltage based on a target value; and
controlling a gate of a transistor of a current-mode logic component using a bias voltage based on the second voltage.

14. The method of claim 13, wherein the first voltage is a function of a first current flowing through a transistor and a resistance of the transistor.

15. The method of claim 14, wherein the second voltage is a function of a second current flowing through a resistor and a resistance of the resistor.

16. The method of claim 15, wherein adjusting includes changing a value of the second current.

17. The method of claim 13, wherein the current-mode logic component is included in a device having an operating temperature range with a first operating temperature limit lower than a second operating temperature limit, and adjusting is performed at a temperature that is closer to the first operating temperature limit than the second operating temperature limit.

18. The method of claim 17, wherein adjusting is performed during a power-up sequence of the device.

* * * * *

UNITED STATES PATENT AND TRADEMARK OFFICE
CERTIFICATE OF CORRECTION

| | |
|---|---|
| PATENT NO. | : 8,278,993 B2 |
| APPLICATION NO. | : 13/025777 |
| DATED | : October 2, 2012 |
| INVENTOR(S) | : Feng Lin |

It is certified that error appears in the above-identified patent and that said Letters Patent is hereby corrected as shown below:

On the Title page, in "Primary Examiner", in column 2, line 1, delete "Ann Luu" and insert -- An Luu --, therefor.

Signed and Sealed this
Eighteenth Day of December, 2012

David J. Kappos
*Director of the United States Patent and Trademark Office*